United States Patent
Okada

(10) Patent No.: US 9,343,503 B2
(45) Date of Patent: May 17, 2016

(54) ELECTROMAGNETIC WAVE DETECTING ELEMENT

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 686 days.

(21) Appl. No.: 12/412,391

(22) Filed: Mar. 27, 2009

(65) Prior Publication Data

US 2009/0250699 A1 Oct. 8, 2009

(30) Foreign Application Priority Data

Apr. 2, 2008 (JP) .................... 2008-096218

(51) Int. Cl.
*H01L 29/04* (2006.01)
*H01L 27/146* (2006.01)

(52) U.S. Cl.
CPC ..... *H01L 27/14663* (2013.01); *H01L 27/14609* (2013.01); *H01L 27/14692* (2013.01)

(58) Field of Classification Search
CPC ................... H01L 27/3258; H01L 27/3272
USPC ........................................................ 257/53
See application file for complete search history.

(56) References Cited

U.S. PATENT DOCUMENTS

| | | | |
|---|---|---|---|
| 5,619,033 A * | 4/1997 | Weisfield | 250/208.1 |
| 6,373,116 B1 | 4/2002 | Teranuma et al. | |
| 7,046,282 B1 | 5/2006 | Zhang et al. | |
| 7,286,173 B2 | 10/2007 | Zhang et al. | |
| 7,615,731 B2 * | 11/2009 | Heiler et al. | 250/214.1 |
| 7,791,117 B2 | 9/2010 | Zhang et al. | |
| 2004/0164230 A1 * | 8/2004 | Izumi et al. | 250/214.1 |
| 2004/0169991 A1 * | 9/2004 | Nagata et al. | 361/301.1 |
| 2006/0001120 A1 * | 1/2006 | Wright | 257/452 |
| 2006/0227232 A1 | 10/2006 | Zhang et al. | |
| 2007/0290246 A1 | 12/2007 | Zhang et al. | |
| 2010/0321357 A1 | 12/2010 | Zhang et al. | |

FOREIGN PATENT DOCUMENTS

| | | |
|---|---|---|
| JP | 11-097690 | 3/1999 |
| JP | 2001-111019 | 4/2001 |
| JP | 2007049122 | 2/2007 |
| JP | 2007-057428 | 3/2007 |
| JP | 2007103578 | 4/2007 |
| JP | 2007192807 | 8/2007 |
| JP | 2007201246 | 8/2007 |

OTHER PUBLICATIONS

Japanese Office Action dated May 29, 2012 issued in the corresponding Japanese Patent Application.

(Continued)

*Primary Examiner* — Elias M Ullah
(74) *Attorney, Agent, or Firm* — SOLARIS Intellectual Property Group, PLLC

(57) ABSTRACT

The present invention provides an electromagnetic wave detecting element that can suppress occurrence of cracking at a substrate peripheral portion, and occurrence of breakage of lead-out wires. An interlayer insulating film is formed so as to cover TFT switches on a substrate. An interlayer insulating film is formed so as to cover semiconductor layer of sensor portions that generate charges due to electromagnetic waves that are an object of detection being irradiated, and cover a region on the substrate where the interlayer insulating film is formed.

5 Claims, 10 Drawing Sheets

(56) References Cited

OTHER PUBLICATIONS

Partial English language translation of the following: Office action dated Jan. 8, 2013 from the Japanese Patent Office in a Japanese patent application corresponding to the instant patent application. This office action translation is submitted now in order to supplement the understanding of patent document JP 2001-111019, JP11-097690 and JP2007-057428 which are cited in the office action and are being disclosed in the instant Information Disclosure Statement.

Office action dated Nov. 26, 2013 from the Japanese Patent Office in a Japanese patent application corresponding to the instant patent application with partial English translation.

* cited by examiner

ELECTROMAGNETIC WAVE DETECTING ELEMENT

CROSS-REFERENCE TO RELATED APPLICATION

This application claims priority under 35 USC 119 from Japanese Patent Application No. 2008-096218, the disclosure of which is incorporated by reference herein.

BACKGROUND OF THE INVENTION

1. Field of the Invention

The present invention relates to an electromagnetic wave detecting element. In particular, the present invention relates to an electromagnetic wave detecting element that uses a TFT (thin-film transistor) active matrix substrate that detects an image and at which sensor portions are provided in correspondence with respective intersection portions of plural scan lines and plural signal lines that are disposed so as to intersect one another.

2. Description of the Related Art

Radiation image detection devices such as FPDs (flat panel detectors), in which an X-ray sensitive layer is disposed on a TFT (thin film transistor) active matrix substrate and that can convert X-ray information directly into digital data, and the like have been put into practice in recent years. As compared with a conventional imaging plate, an image can be confirmed immediately at an FPD. Further, the FPD has the advantage that video images as well can be confirmed. Therefore, the popularization of FPDs has advanced rapidly.

Various types of radiation image detection devices are proposed. For example, there is a direct-conversion-type radiation image detection device that converts radiation directly into charges and accumulates the charges. Moreover, there is an indirect-conversion-type radiation image detection device that once converts radiation into light at a scintillator of CsI:Tl, GOS (Gd2O2S:Tb), or the like, and, at semiconductor layer, converts the converted light into charges and accumulates the charges.

At the electromagnetic wave detecting element, sensor portions, that generate charges due to electromagnetic waves that are the object of detection being irradiated, are provided on a TFT active matrix substrate at which plural scan lines and plural signal lines are disposed so as to intersect one another, and TFT switching elements are provided at the respective intersection portions of the scan lines and the signal lines. However, the sensor portions must be provided so as to avoid the TFT switching element portions.

Thus, U.S. Pat. No. 5,619,033 discloses a structure in which flattening (leveling) films (interlayer insulating films) are provided above and below the sensor portions. In the technique of U.S. Pat. No. 5,619,033, the scan lines, the signal lines and the TFT switching elements are covered by a lower layer flattening film such that the surfaces thereof are flattened (leveled), and sensor portions are provided on this lower layer flattening film. Due thereto, there is no need for the sensor portions to be disposed to avoid the TFT switching element portions, and the surface areas of the sensor portions can be made larger. Further, by covering the sensor portions with an upper layer flattening film and filling in the gaps between the respective sensor portions, edge defects at the time of upper layer metal patterning can be prevented.

However, in a case of providing flattening films above and beneath the sensor portions by using the technique disclosed in U.S. Pat. No. 5,619,033, it becomes easy for cracking of the peripheral portion of the substrate and breakage of the lead-out wires to arise.

For example, as shown in FIG. 9, a substrate 1', at which the scan lines, the signal lines and the TFT switching elements are provided, is covered by a first flattening film 12'. Sensor portions 103' are provided on the first flattening film 12', and a second flattening film 18' is provided on the first flattening film 12' so as to cover the sensor portions 103'. In this case, because there are the two layers of flattening films, i.e., the first flattening film 12' and the second flattening film 18', there is an increased number of steps (number of stepped levels due to layered films) at the peripheral portion of the substrate 1'. Further, at the time of patterning the second flattening film 18' on the first flattening film 12', it is easy for residue to remain on the first flattening film 12' at the edge portions of the second flattening film 18'. Such steps and residue may cause cracking of the upper layer films that starts at the steps or the residue, or may cause breakage of the lead-out wires.

SUMMARY OF THE INVENTION

The present invention provides an electromagnetic wave detecting element that can suppress the occurrence of cracks at the peripheral portion of a substrate, and the occurrence of breakage of lead-out wires.

A first aspect of the present invention is an electromagnetic wave detecting element having: a substrate including a plurality of scan lines and a plurality of signal lines disposed to intersect one another, and TFT switching elements provided at respective intersection portions of the scan lines and the signal lines; a first flattening film formed to cover the TFT switching elements of the respective intersection portions on the substrate, and flattening a surface; sensor portions provided on the first flattening film to correspond respectively to the intersection portions, and connected respectively to the TFT switching elements, and generating charges as a result of electromagnetic waves that are an object of detection being irradiated; and a second flattening film formed to cover the sensor portions on the first flattening film and a region on the substrate at which the first flattening film is formed, and flattening a surface.

At the electromagnetic wave detecting element of the first aspect, the plural scan lines and the plural signal lines are disposed on the substrate so as to intersect one another, and the TFT switching elements are provided at the respective intersection portions of the scan lines and the signal lines. Further, at the electromagnetic wave detecting element of the first aspect, the first flattening film that flattens the surface is formed so as to cover the TFT switching elements of the respective intersection portions on the substrate. Moreover, at the electromagnetic wave detecting element of the first aspect, the sensor portions, that generate charges due to electromagnetic waves that are the object of detection being irradiated, are provided on the first flattening film to correspond respectively to the intersection portions, and are connected respectively to the TFT switching elements.

Further, in the first aspect, the second flattening film that flattens the surface is formed to cover the sensor portions on the first flattening film and a region on the substrate at which region the first flattening film is formed.

In this way, at the electromagnetic wave detecting element of the first aspect, the first flattening film is formed to cover the TFT switching elements on the substrate. Moreover, at the electromagnetic wave detecting element of the first aspect, the second flattening film is formed to cover the sensor portions and the region on the substrate where the first flattening film is formed. Accordingly, the number of steps at the peripheral portion of the substrate decreases, and residue does not remain on the first flattening film at the time of patterning the second flattening film. Due thereto, the occurrence of cracks at the peripheral portion of the substrate, and the occurrence of breakage of lead-out wires, can be suppressed.

In a second aspect of the present invention, the electromagnetic wave detecting element of the above-described aspect may further include a protective insulating film formed of an inorganic material and provided between the first flattening film and the second flattening film.

In a third aspect of the present invention, the electromagnetic wave detecting element of the above-described aspect may further include a protective insulating film formed of an inorganic material and covering the second flattening film.

In a fourth aspect of the present invention, in the above-described aspect, the sensor portions may generate charges as a result of light being illuminated, and the electromagnetic wave detecting element may further include a wavelength converting layer provided on the second flattening film such that end portions of the wavelength converting layer are at an inner side of the second flattening film, the wavelength converting layer converting radiation into light.

In a fifth aspect of the present invention, in the above-described aspect, the wavelength converting layer may be formed in a shape of a sheet of a size that is smaller than a size of a region at which the second flattening film is formed, and may be provided on the second flattening film by being affixed such that the end portions of the wavelength converting layer are at the inner side of the second flattening film.

Here, the electromagnetic waves mean electromagnetic waves that are mainly detected at the sensor portions. For example, in the case of an electromagnetic wave detecting element that is used in an indirect-conversion-type radiation image detection device, the light that is emitted by the scintillator corresponds to the electromagnetic waves.

In this way, in accordance with the present invention, the occurrence of cracks at the peripheral portion of a substrate, and the occurrence of breakage of lead-out wires, can be suppressed.

BRIEF DESCRIPTION OF THE DRAWINGS

Exemplary embodiments of the present invention will be described in detail based on the following figures, wherein.

DETAILED DESCRIPTION OF THE INVENTION

Figure 1:
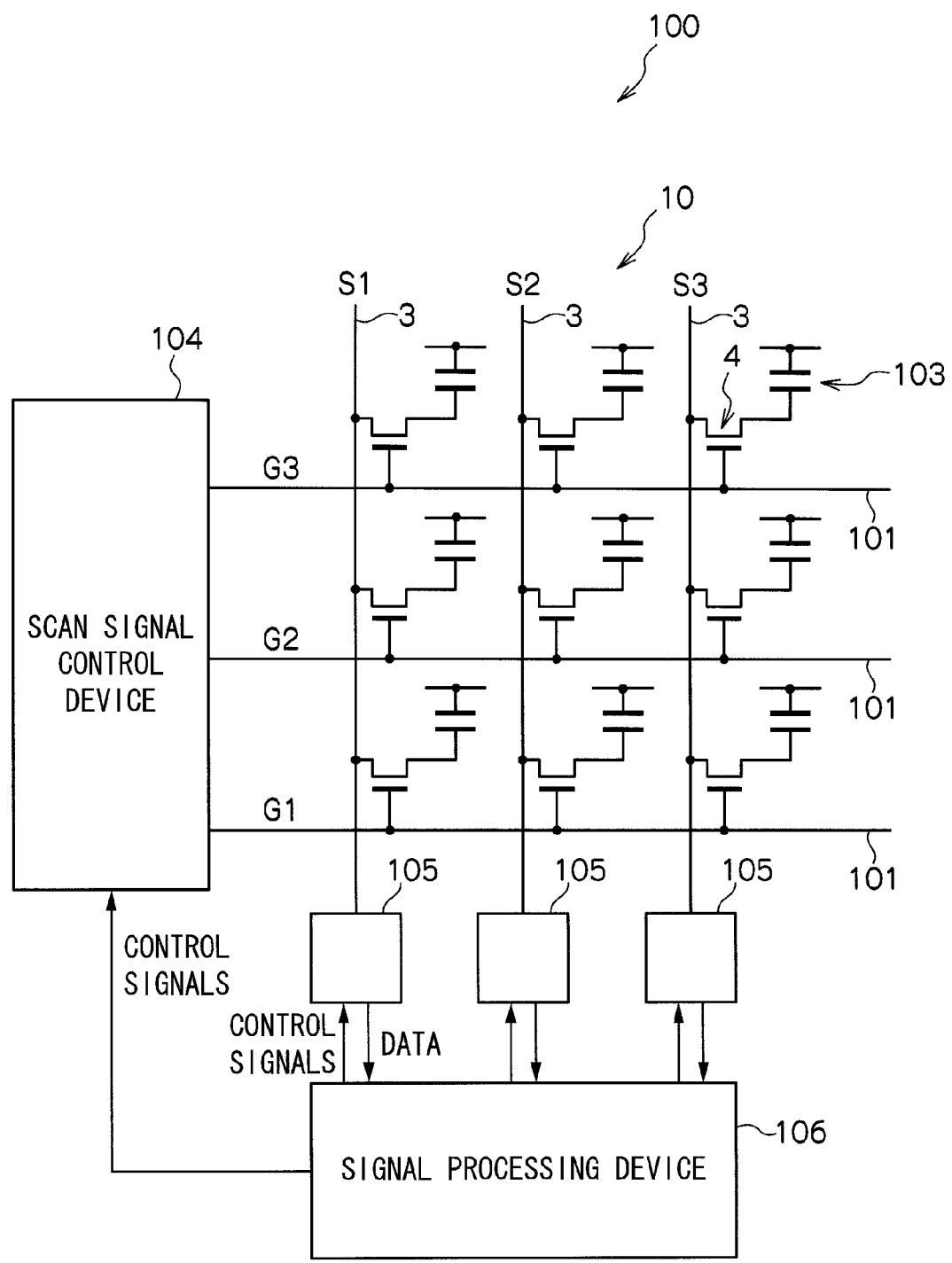
FIG. 1 is a structural drawing showing the overall structure of a radiation image detection device relating to an exemplary embodiment.

Exemplary embodiments of the present invention will be described hereinafter with reference to the drawings. Note that, hereinafter, cases will be described in which the present invention is applied to an indirect-conversion-type radiation image detection device 100. The overall structure of the radiation image detection device 100 relating to the present exemplary embodiment is illustrated in FIG. 1. However, a scintillator that converts radiation into light is not illustrated.

As shown in FIG. 1, the radiation image detection device 100 relating to the present exemplary embodiment has an electromagnetic wave detecting element 10.

The electromagnetic wave detecting element 10 has upper electrodes, semiconductor layer, and lower electrodes that will be described later. Numerous pixels that are structured to include sensor portions 103 and TFT switches 4 are provided in a two-dimensional form at the electromagnetic wave detecting element 10. The sensor portion 103 receives light, that is obtained by irradiated radiation being converted at a scintillator, and accumulates charges. The TFT switch 4 reads-out the charges accumulated in the sensor portion 103.

Plural scan lines 101 and plural signal lines 3 are provided at the electromagnetic wave detecting element 10 so as to intersect one another. The plural scan lines 101 turn the TFT switches 4 ON and OFF. The plural signal lines 3 read-out the charges accumulated in the sensor portions 103.

Any of the TFT switches 4 that are connected to the signal lines 3 are turned ON. Due thereto, electric signals corresponding to the charge amounts accumulated in the sensor portions 103 flow to the signal lines 3. Signal detecting circuits 105, that detect the electric signals that flow-out to the signal lines 3, are connected to the respective signal lines 3. Further, a scan signal controlling device 104, that outputs control signals for turning the TFT switches 4 ON and OFF to the scan lines 101, is connected to the respective scan lines 101.

The signal detecting circuits 105 incorporate therein, for each of the signal lines 3, an amplifying circuit that amplifies the inputted electric signal. At the signal detecting circuits 105, the electric signals that are inputted from the respective signal lines 3 are amplified by the amplifying circuits and detected. The signal detecting circuits 105 thereby detect the charge amounts accumulated in the respective sensor portions 103 as information of the respective pixels structuring the image.

A signal processing device 106 is connected to the signal detecting circuits 105 and the scan signal controlling device 104. The signal processing device 106 carries out predetermined processings on the electric signals detected at the signal detecting circuits 105, and outputs control signals expressing signal detecting timings to the signal detecting circuits 105, and outputs control signals expressing scan signal outputting timings to the scan signal controlling device 104.

Figure 2:
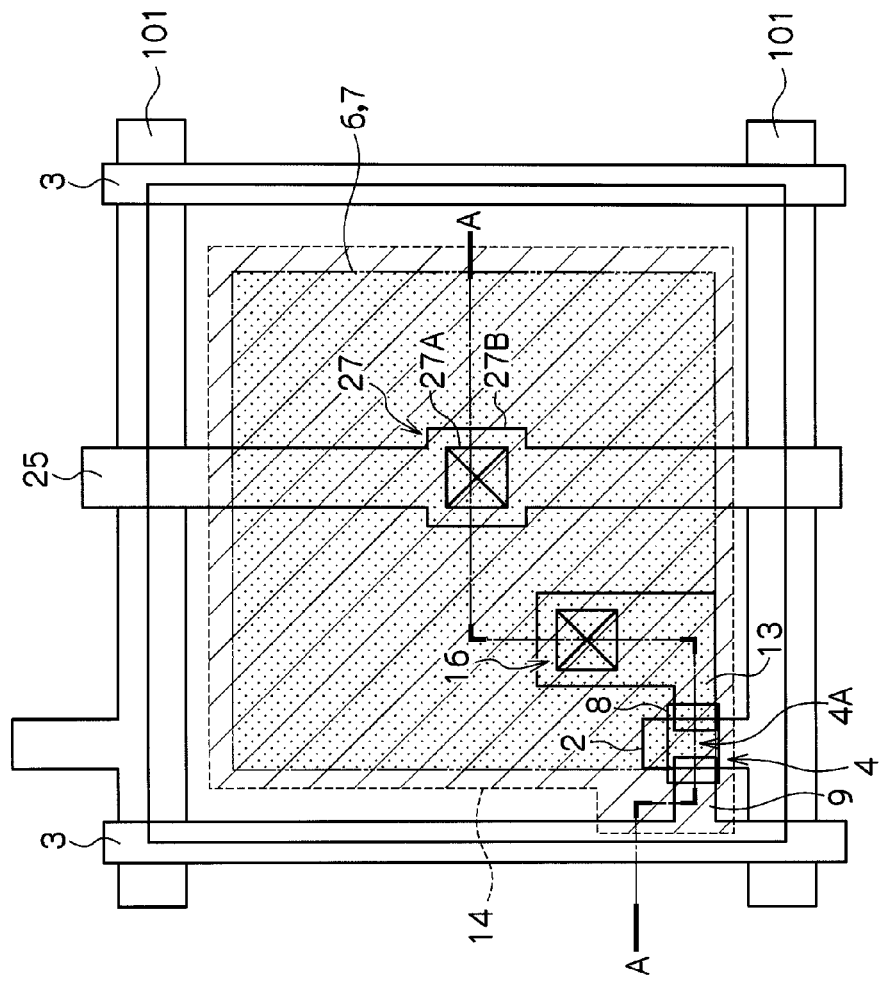
FIG. 2 is a plan view showing the structure of one pixel unit of an electromagnetic wave detecting element relating to the exemplary embodiment.

Next, the electromagnetic wave detecting element 10 relating to the present exemplary embodiment will be described in further detail with reference to FIG. 2 and FIG. 3. Note that a plan view showing the structure of one pixel unit of the electromagnetic wave detecting element 10 relating to the present exemplary embodiment is shown in FIG. 2. A cross-sectional view along line A-A of FIG. 2 is shown in FIG. 3.

Figure 3:
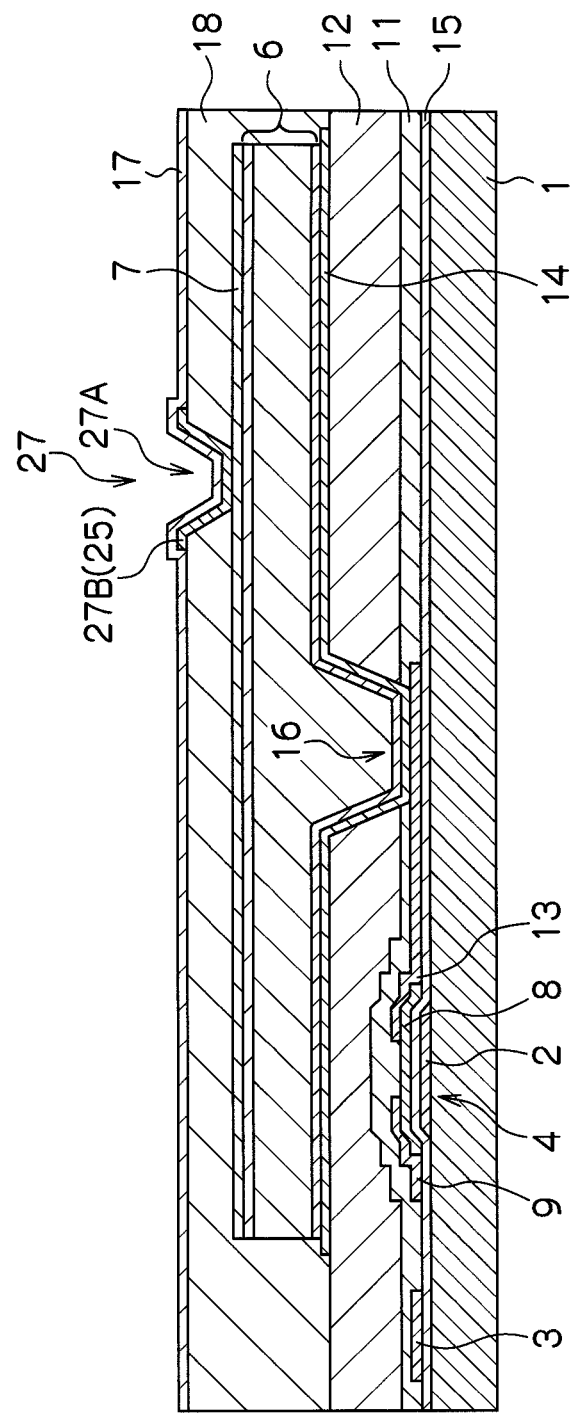
FIG. 3 is a line cross-sectional view of one pixel unit of the electromagnetic wave detecting element relating to the exemplary embodiment.

As shown in FIG. 3, the electromagnetic wave detecting element 10 is structured such that the scan lines 101 and gate electrodes 2 are formed on an insulative substrate 1 that is formed from alkaline-free glass or the like. The scan lines 101 and the gate electrodes 2 are connected (see FIG. 2). The wiring layer at which the scan lines 101 and the gate electrodes 2 are formed (hereinafter, this wiring layer is also called a "first signal wiring layer") is formed by using Al or Cu, or a layered film formed including Al or Cu. However, the materials of the wiring layer are not limited to these.

An insulating film 15 is formed on the entire surface on the scan lines 101 and the gate electrodes 2, so as to cover the scan lines 101 and the gate electrodes 2. The region of the insulating film 15 that is positioned above the gate electrode 2 works as a gate insulating film of the TFT switch 4. The insulating film 15 is formed of, for example, $SiN_X$ or the like. The insulating film 15 is formed by, for example, CVD (Chemical Vapor Deposition).

Semiconductor active layers 8 are formed as islands above the gate electrodes 2 on the insulating film 15. The semiconductor active layer 8 is the channel portion of the TFT switch 4, and is formed from, for example, an amorphous silicon film.

A source electrode 9 and a drain electrode 13 are formed at the upper layer of the above-described layers. Together with the source electrodes 9 and the drain electrodes 13, the signal lines 3 are formed at the wiring layer at which the source electrodes 9 and the drain electrodes 13 are formed. The source electrodes 9 are connected to the signal lines 3. The wiring layer in which the signal lines 3 and the source electrodes 9 are formed (hereinafter, this wiring layer is also called a "second signal wiring layer") is formed by using Al or Cu, or a layered film formed including Al or Cu. However, the materials of the wiring layer are not limited to these.

A contact layer (not shown) is formed between, on the one hand, the source electrode 9 and the drain electrode 13, and, on the other hand, the semiconductor active layer 8. The contact layer is formed from an impurity-added semiconductor such as an impurity-added amorphous silicon or the like. The TFT switch 4 for switching is structured by the above-described layers.

A TFT protecting film layer 11 is formed on substantially the entire surface of the region on the substrate 1 where the pixels are provided (substantially the entire region), so as to cover the semiconductor active layers 8, the source electrodes 9, the drain electrodes 13, and the signal lines 3. The TFT protecting film layer 11 is formed of, for example, $SiN_X$ or the like. The TFT protecting film layer 11 is formed by, for example, CVD.

A coating-type interlayer insulating film 12 is formed on the TFT protecting film layer 11. The interlayer insulating film 12 is formed to a film thickness of 1 to 4 µm from a photosensitive organic material (e.g., a positive photosensitive acrylic resin: a material in which a naphthoquinonediazide positive photosensitive agent is mixed together with a base polymer formed from a copolymer of methacrylic acid and glycidyl methacrylate, or the like) having a low permittivity (dielectric constant $\in_r=2$ to 4). In the electromagnetic wave detecting element 10 relating to the present exemplary embodiment, the capacity between the metals that are disposed at the upper layer and the lower layer of the interlayer insulating film 12 is kept low by the interlayer insulating film 12. Further, generally, a material such as the above also functions as a flattening film, and also has the effect of flattening the steps of the lower layer. The shapes of semiconductor layer 6 that are disposed at the upper layer are flattened by the interlayer insulating film 12. Therefore, a decrease in the absorption efficiency due to unevenness of the semiconductor layer 6, and an increase in leak current can be suppressed. Contact holes 16 are formed in the interlayer insulating film 12 and the TFT protecting film layer 11 at positions opposing the drain electrodes 13 and at positions at the irradiation surface sides of the regions where the scan lines 101 are formed.

A lower electrode 14 of the sensor portion 103 is formed on the interlayer insulating film 12, so as to cover the pixel region while filling-in the contact hole 16. The lower electrode 14 is connected to the drain electrode 13 of the TFT switch 4. If the semiconductor layer 6 that will be described later is thick and around 1 µm, there are hardly any limitations on the material of the lower electrode 14 provided that it is electrically-conductive. Therefore, the lower electrode 14 can be formed by using an electrically-conductive metal such as an Al-type material, ITO (indium tin oxide), or the like.

On the other hand, if the film thickness of the semiconductor layer 6 is thin (around 0.2 to 0.5 µm), the absorption of light at the semiconductor layer 6 is insufficient. In order to prevent an increase in leak current due to the illumination of light onto the TFT switch 4, it is preferable to make the lower electrode 14 be an alloy or a layered film that is formed including a light-shielding metal.

The semiconductor layer 6 that functions as a photodiode is formed on the lower electrode 14. In the present exemplary embodiment, a PIN structure photodiode is employed as the semiconductor layer 6, and the semiconductor layer 6 is formed by layering an $n^+$ layer, an i layer, and a $p^+$ layer in that order from the lower layer. In the present exemplary embodiment, the lower electrode 14 is made to be larger than the semiconductor layer 6. Note that, if the film thickness of the semiconductor layer 6 is thin (e.g., less than or equal to 0.5 µm), in order to prevent incidence of light onto the TFT switch 4, it is preferable to place a light-shielding metal at the lower electrode 14 and cover the TFT switch 4.

In order to suppress the advancing of light into the TFT switch 4 due to irregular reflection of light at the device interior, the interval from the channel portion of the TFT switch 4 to the end portion of the lower electrode 14 that is formed from a light-shielding metal is ensured to be greater than or equal to 5 µm.

An upper electrode 7 is formed on the semiconductor layer 6. The upper electrode 7 is formed of a material having high light transmittance such as, for example, ITO or IZO (indium zinc oxide) or the like.

Figure 4:
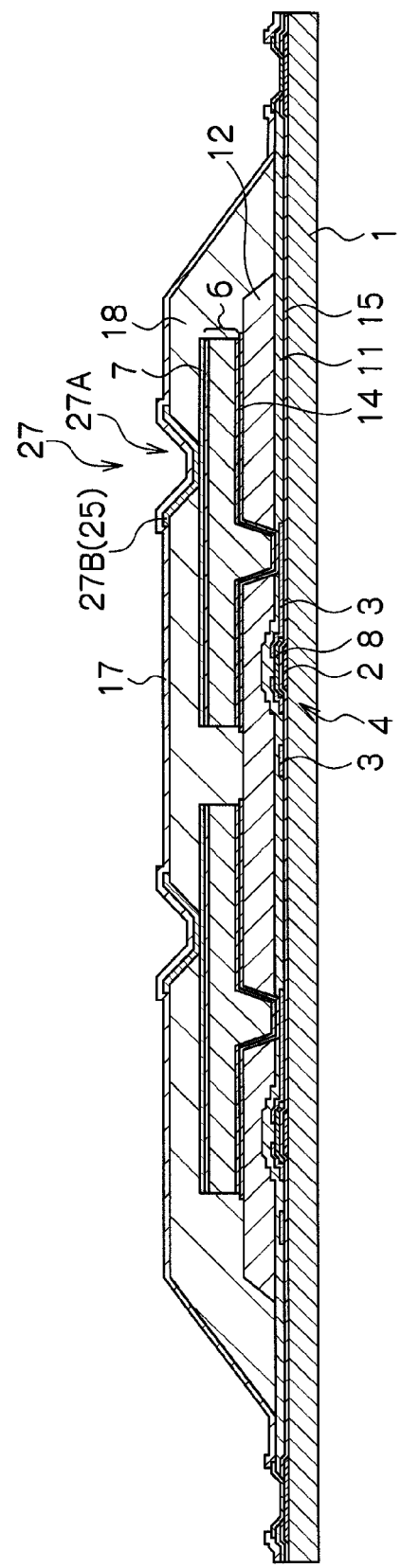
FIG. 4 is a line cross-sectional view of the electromagnetic wave detecting element relating to the exemplary embodiment.

A coating-type interlayer insulating film 18 is formed on the interlayer insulating film 12 and the respective upper electrodes 7, so as to cover the semiconductor layer 6 while having openings at the semiconductor layer 6 portions. As shown in FIG. 4, in the present exemplary embodiment, the interlayer insulating film 18 is formed so as to cover the region where the interlayer insulating film 12 is formed on the substrate 1. In the same way as the interlayer insulating film 12, the interlayer insulating film 18 is formed to a film thickness of 1 to 4 µm from a photosensitive organic material having low permittivity. The interlayer insulating film 18 also functions as a flattening film, and has the effect that steps at the lower layers are flattened thereby.

A common electrode line 25, that is Al or Cu or is an alloy or a layered film formed including Al or Cu, is formed on the interlayer insulating film 18.

Further, a contact portion 27 is provided at the interlayer insulating film 18 in order to connect the common electrode line 25 and the upper electrode 7.

A contact hole 27A, that is formed in the interlayer insulating film 18, is provided at the center of the contact portion 27. A contact 27B is provided at the contact portion 27 to cover the contact hole 27A. The common electrode line 25 is electrically connected to the upper electrode 7 via the contact portion 27 provided at the interlayer insulating film 18.

A protective insulating film 17 is formed on the interlayer insulating film 18 and the common electrode line 25. In the same way as the TFT protecting film layer 11, the protective insulating film 17 is formed of, for example, $SiN_X$ or the like. The protective insulating film 17 is formed by, for example, CVD.

Figure 5:
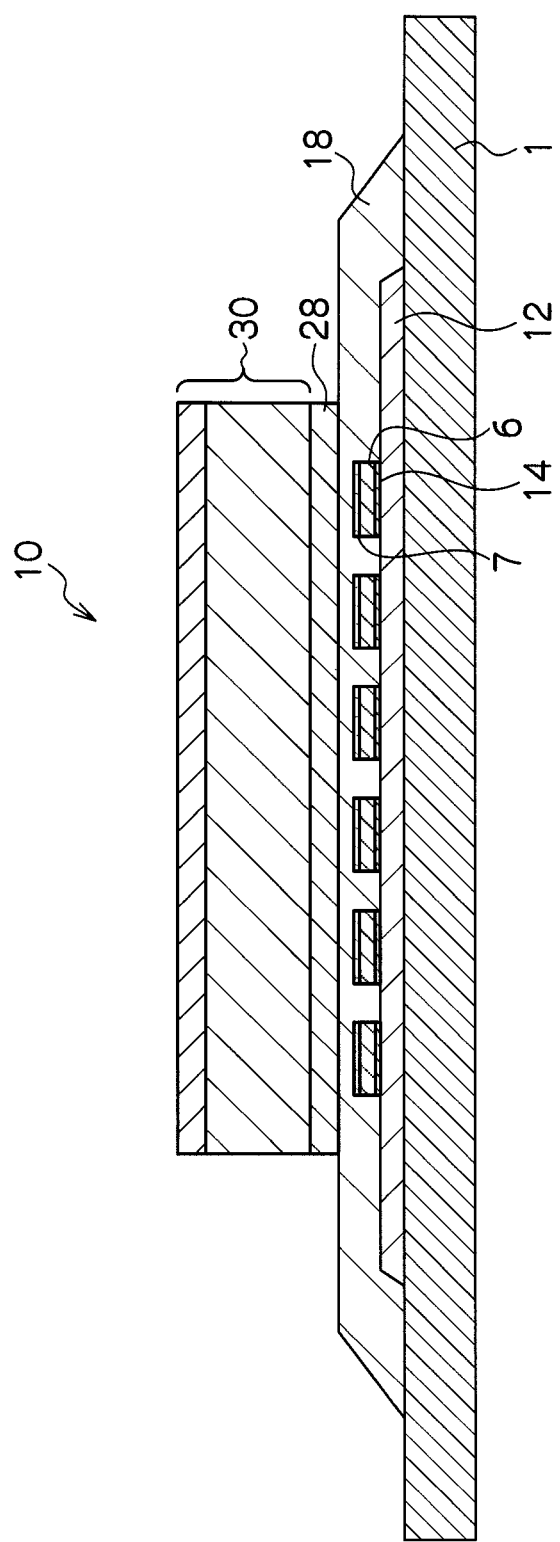
FIG. 5 is a line cross-sectional view showing the schematic structure of the electromagnetic wave detecting element to which a scintillator is affixed, relating to the exemplary embodiment.

As shown in FIG. 5, a scintillator 30 formed of GOS or the like is affixed to the electromagnetic wave detecting element 10 that is formed as described above, by using an adhesive resin 28 having low light absorbance, or the like.

The scintillator 30 is formed in the shape of a sheet at a size that is smaller than the size of the region at which the interlayer insulating film 18 is formed. Further, the scintillator 30 is affixed to the electromagnetic wave detecting element 10 such that the end portions of the scintillator 30 are at the inner side of the interlayer insulating film 18.

Figure 6:
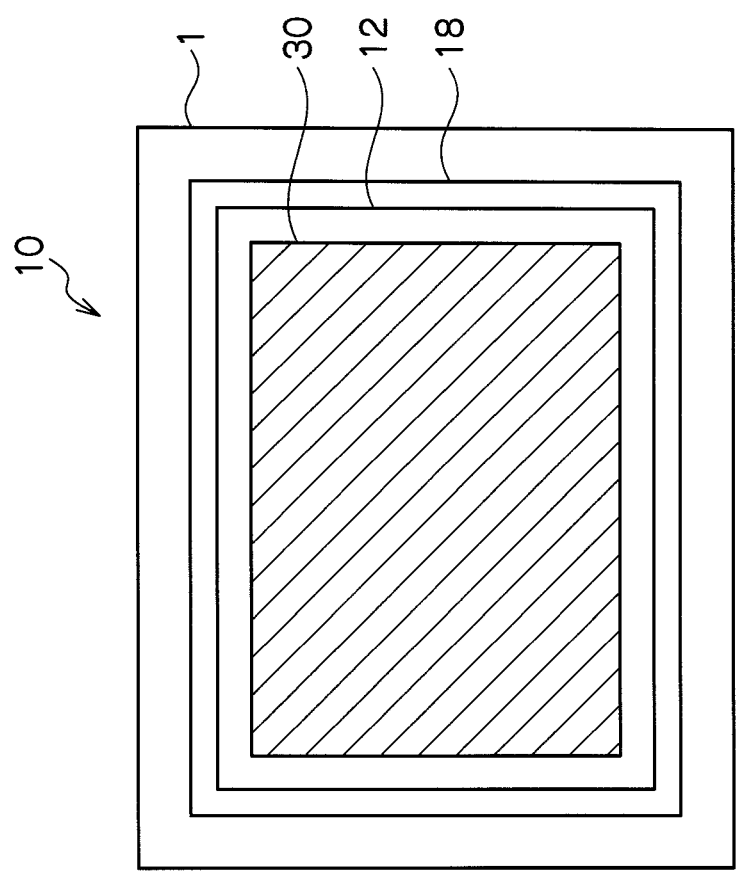
FIG. 6 is a plan view showing a region where a scintillator is affixed, a region where an interlayer insulating film is formed, and a region where an interlayer insulating film is formed, of the electromagnetic wave detecting element relating to the exemplary embodiment.

FIG. 6 shows the region where the scintillator 30 is affixed, the region where the interlayer insulating film 18 is formed and the region where the interlayer insulating film 12 is formed, when the electromagnetic wave detecting element 10 is viewed from the front surface.

As shown in FIG. 6, at the electromagnetic wave detecting element 10, the size of the scintillator 30 is the smallest, and the scintillator 30 is affixed at the inner side of the region where the interlayer insulating film 18 is formed. Further, the region where the interlayer insulating film 18 is formed covers the region where the interlayer insulating film 12 is formed.

Next, an example of the processes of fabricating the electromagnetic wave detecting element 10 relating to the first exemplary embodiment will be described with reference to FIG. 7A through FIG. 7J.

Figure 7A:
FIG. 7A through FIG. 7J are drawings for explaining processes of fabricating the electromagnetic wave detecting element relating to the exemplary embodiment.

First, the gate electrodes 2 and the scan lines 101 are formed on the substrate 1 as the first signal wiring layer (FIG. 7A). This first signal wiring layer is formed from a low-resistance metal such as Al, an Al alloy or the like, or from a layered film that is layered with a barrier metal layer formed from a high melting point metal. The film thickness of the first signal wiring layer is around 100 to 300 nm. The metal film is deposited on the substrate 1 by sputtering. Thereafter, patterning of a resist film is carried out with respect to the metal film by a photolithographic technique. Thereafter, the metal film is patterned by wet etching using an etchant for Al or by dry etching. By removing the resist thereafter, the first signal wiring layer is completed.

Figure 7B:

Next, the insulating film 15, the semiconductor active layers 8, and the contact layers (not shown) are successively deposited on the first signal wiring layer (FIG. 7B). The insulating film 15 is formed from SiNx. The film thickness of the insulating film 15 is 200 to 600 nm. The semiconductor active layers 8 are formed from amorphous silicon. The film thickness of the semiconductor active layers 8 is around 20 to 200 nm. The contact layers are formed from an impurity-added amorphous silicon. The contact layers have a film thickness of around 10 to 100 nm. The contact layers are formed by being deposited by P-CVD (Plasma-Chemical Vapor Deposition). Thereafter, in the same way as the first signal wiring layer, patterning of the resist is carried out by a photolithographic technique. Thereafter, the semiconductor active regions are formed by selectively dry etching, with respect to the insulating film 15, the semiconductor active layers 8 and the contact layers that are formed by an impurity-added semiconductor.

Figure 7C:
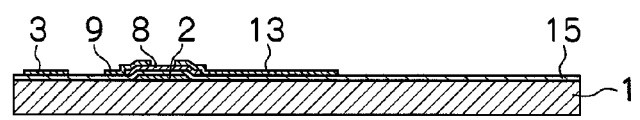
Figure 7D:
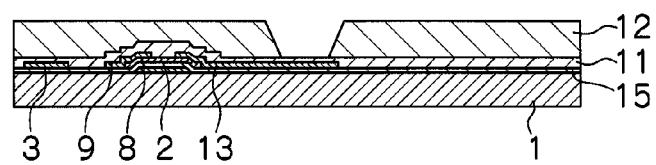

Next, the signal lines 3, the source electrodes 9, and the drain electrodes 13 are formed as the second signal wiring layer at the top layer of the insulating film 15 and the semiconductor active layers 8 (FIG. 7C). In the same way as the first signal wiring layer, the second signal wiring layer is formed from a low-resistance metal such as Al, an Al alloy or the like, or from a layered film that is layered with a barrier metal layer formed from a high melting point metal, or from a single layer of a high melting point metal film such as Mo or the like. The film thickness of the second signal wiring layer is around 100 to 300 nm. In the same way as the first signal wiring layer, the second signal wiring layer is formed by patterning being carried out by a photolithographic technique, and the metal film being patterned by wet etching using an etchant for Al or by dry etching. By selectively employing the etching method at this time, the insulating film 15 is not removed. Next, by dry etching, portions of the contact layers and the semiconductor active layers 8 are removed, and channel regions are formed.

Next, the TFT protecting film layer 11 and the interlayer insulating film 12 are successively formed at the upper layer of the layers that were formed as described above (FIG. 7D). The TFT protecting film layer 11 and the interlayer insulating film 12 are formed by a single body of an inorganic material, or are formed by layering a protective insulating film formed of an inorganic material and an interlayer insulating film formed of an organic material, or are formed by a single layer of an interlayer insulating film that is organic. In the present exemplary embodiment, there is a layered structure of the interlayer insulating film 12 that is photosensitive and the TFT protecting film layer 11 that is formed of an inorganic material, in order to stabilize the characteristics of the TFT switch 4 and suppress the electrostatic capacity between the lower electrode 14 and the common electrode line 25 at the lower layer. Therefore, in the present exemplary embodiment, for example, the TFT protecting film layer 11 is formed by CVD, and the interlayer insulating film 12 material that is photosensitive and is a coating material is coated, pre-baked, subjected to exposure, developed, and baked, in order to form the respective layers.

Figure 7E:
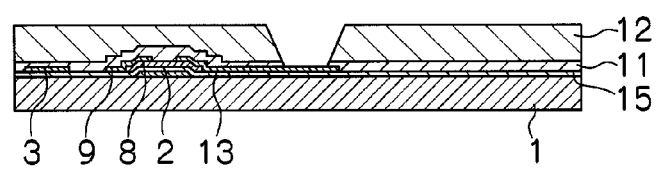

Next, the TFT protecting film layer 11 is patterned by a photolithographic technique (FIG. 7E). Note that this step is not necessary in cases in which the TFT protecting film layer 11 is not provided.

Figure 7F:
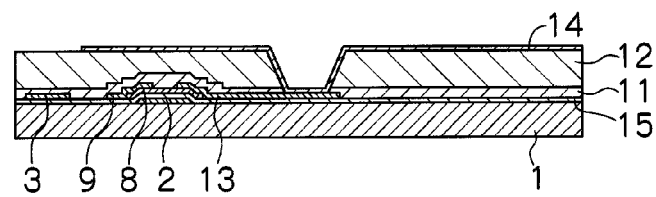

Next, an Al-type material or a metal material such as ITO or the like is deposited by sputtering to a film thickness of around 20 to 200 nm on the top layer of the above-described layers. Then, patterning is carried out by a photolithographic technique, and patterning is carried out by wet etching using an etchant for metal or the like or by dry etching, so as to form the lower electrodes 14 (FIG. 7F).

Figure 7G:
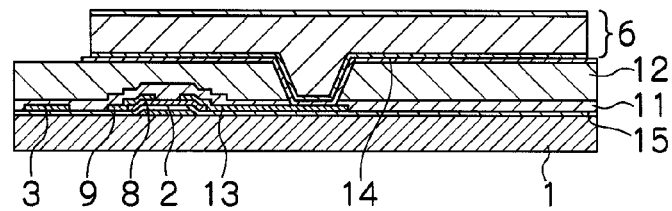

Next, respective layers of $n^+$, $i$, $p^+$ are deposited in order from the lower layer by using CVD, so as to form the semiconductor layer 6 (see FIG. 7G). The film thickness of the $n^+$ layer is 50 to 500 nm, the film thickness of the i layer is 0.2 to 2 μm, and the film thickness of the $p^+$ layer is 50 to 500 nm. The respective layers of the semiconductor layer 6 are layered in order, and the semiconductor layer 6 is patterned by a photolithographic technique. Next, by selectively etching the interlayer insulating film 12 at the lower layer by dry etching or by wet etching, the semiconductor layer 6 is completed.

Here, in the present exemplary embodiment, the semiconductor layer 6 is formed by layering n$^+$, i, p$^+$ in that order. However, the semiconductor layer 6 may be made to be a PIN diode by layering p$^+$, i, n$^+$ in that order. In this case, the source electrode 9 and the drain electrode 13 of the TFT switch 4 are reversed.

Figure 7H:
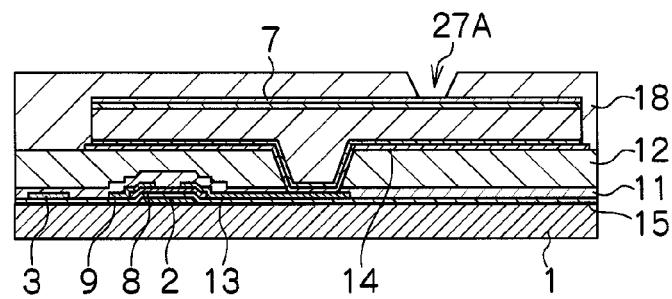

Next, the upper electrodes 7 are formed on the semiconductor layer 6, and the interlayer insulating film 18 is formed on the interlayer insulating film 12 and the upper electrodes 7 (FIG. 7H). The upper electrodes 7 are formed by depositing a transparent electrode material such as ITO or the like by sputtering at the top layers of the semiconductor layer 6. The thickness of deposited film is around 20 to 200 nm. The transparent electrode material is patterned by a photolithographic technique, and is patterned by wet etching using an etchant for ITO or the like or by dry etching. Similarly to the formation of the interlayer insulating film 12, the interlayer insulating film 18 is formed by a photosensitive material, which is a coating material, being coated, pre-baked, subjected to exposure, developed, and baked, and the contact holes 27A being formed.

Figure 7I:
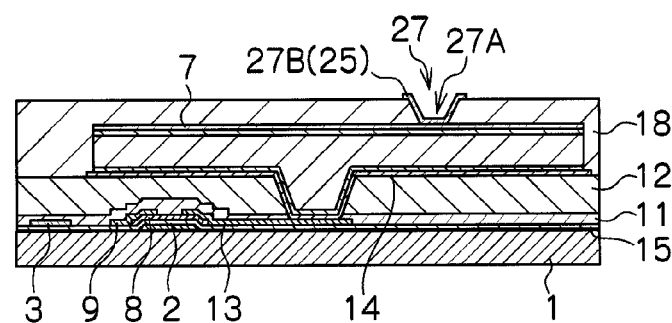

Next, the common electrode lines 25 and the contact portions 27 are formed (FIG. 7I). The common electrode lines 25 and the contacts 27B are formed by depositing Al or Cu, or a metal material such as an alloy formed including Al or Cu, or the like, by sputtering onto the top layer of the layers that were formed as described above. The thickness of the deposited film is around 100 to 500 nm. Next, the deposited film is patterned by a photolithographic technique and by wet etching using an etchant for metal or the like or by dry etching, such that the common electrode lines 25 and the contacts 27B are formed.

Figure 7J:
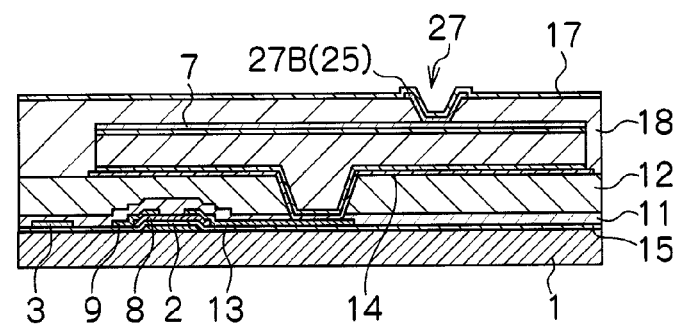

Next, the protective insulating film 17 that is formed from an SiNx film is deposited by CVD or the like so as to cover the semiconductor layer 6 (FIG. 7J). The thickness of the deposited film is around 100 to 300 nm. Here, the depositing of SiNX by using CVD is given as an example. However, the protective insulating film 17 is not limited to SiNx, and another material may be applied provided that it is an insulating material.

Finally, the scintillator 30 formed of GOS is affixed, by using the adhesive resin 28 or the like, to the electromagnetic wave detecting element 10 that is formed in this way. The electromagnetic wave detecting element 10 shown in FIG. 5 is thereby formed.

Principles of the operation of the radiation image detection device 100 of the above-described structure will be described next.

When X-rays are irradiated from above in FIG. 5, the irradiated X-rays are absorbed by the scintillator 30 and are converted into visible light. The X-rays may be irradiated from below in FIG. 5. In this case as well, the X-rays are absorbed by the scintillator 30 and are converted into visible light. The light amount generated from the scintillator 30 is 0.5 to 2 $\mu$W/cm$^2$ in usual X-ray photography for medical diagnosis. This generated light passes through the layer of the adhesive resin 28, and is illuminated onto the semiconductor layer 6 of the sensor portions 103 that are arranged in the form of an array on the TFT array substrate.

At the electromagnetic wave detecting element 10, the semiconductor layer 6 is provided to be separated into the respective pixel units. A predetermined bias voltage is applied to the semiconductor layer 6 from the upper electrode 7 via the common electrode line 25. When light is illuminated, charges are generated at the interior of the semiconductor layer 6. For example, in the case of the semiconductor layer 6 having a PIN structure that is layered in the order of n$^+$, i, p$^+$ (n$^+$ amorphous silicon, amorphous silicon, p$^+$ amorphous silicon) from the lower layer, negative bias voltage is applied to the upper electrode 7. If the film thickness of the I layer is around 1 $\mu$m, the bias voltage that is applied is around −5 to −10 V. When light is not illuminated, only current that is less than or equal to several pA/mm$^2$ flows at the semiconductor layer 6. On the other hand, when light is illuminated (100 $\mu$W/cm$^2$), the semiconductor layer 6 generates light current of around 0.3 $\mu$A/mm$^2$. The generated charges are collected by the lower electrode 14. At the time of image detection, negative bias is applied to the gate electrode 2 of the TFT switch 4 and the TFT switch 4 is maintained in an OFF state, and the charges collected by the lower electrode 14 are accumulated.

At the time of reading-out the image, ON signals (+10 to 20 V) are successively applied to the gate electrodes 2 of the TFT switches 4 via the scan lines 101. Due to the TFT switches 4 being successively turned ON, electric signals corresponding to the charge amounts accumulated in the lower electrodes 14 flow-out to the signal lines 3. On the basis of the electric signals that flow-out to the signal lines 3, the signal detecting circuits 105 detect the charge amounts accumulated in the respective sensor portions 103 as information of the respective pixels structuring the image. The image information expressing the image, that is expressed by the X-rays that are irradiated onto the electromagnetic wave detecting element 10, can thereby be obtained.

As shown in FIG. 4, the surface of the electromagnetic wave detecting element 10, relating to the present exemplary embodiment, is flattened by forming the electromagnetic wave detecting element 10 such that the interlayer insulating film 18 covers the semiconductor layer 6 of the sensor portions 103 and covers the region on the substrate 1 where the interlayer insulating film 12 is formed.

Due thereto, the steps due to the interlayer insulating film 12 are covered by the interlayer insulating film 18, and only the interlayer insulating film 18 at the peripheral portion of the substrate 1 has steps. Therefore, the number of steps at the peripheral portion of the substrate 1 is reduced, and further, residue does not remain on the interlayer insulating film 12 at the time of patterning the interlayer insulating film 18. Thus, the present exemplary embodiment can suppress the occurrence of cracks at the peripheral portion of the substrate, and the occurrence of breakage of lead-out wires.

Further, at the electromagnetic wave detecting element 10, relating to the present exemplary embodiment, the surface is flattened by the interlayer insulating film 18, and the sheet-shaped scintillator 30, whose size is smaller than the size of the region where the interlayer insulating film 18 is formed, is affixed such that the end portions of the scintillator 30 are at the inner side of the interlayer insulating film 18.

Due thereto, the flatness of the adhesion surface of the substrate 1 to which the scintillator 30 is adhered improves, and the adhesion with the scintillator 30 improves. In particular, in the present exemplary embodiment, by adhering the end portions of the scintillator 30 at the inner side of the interlayer insulating film 18, peeling-off of film from the end portions of the scintillator 30 can be suppressed.

Figure 8:
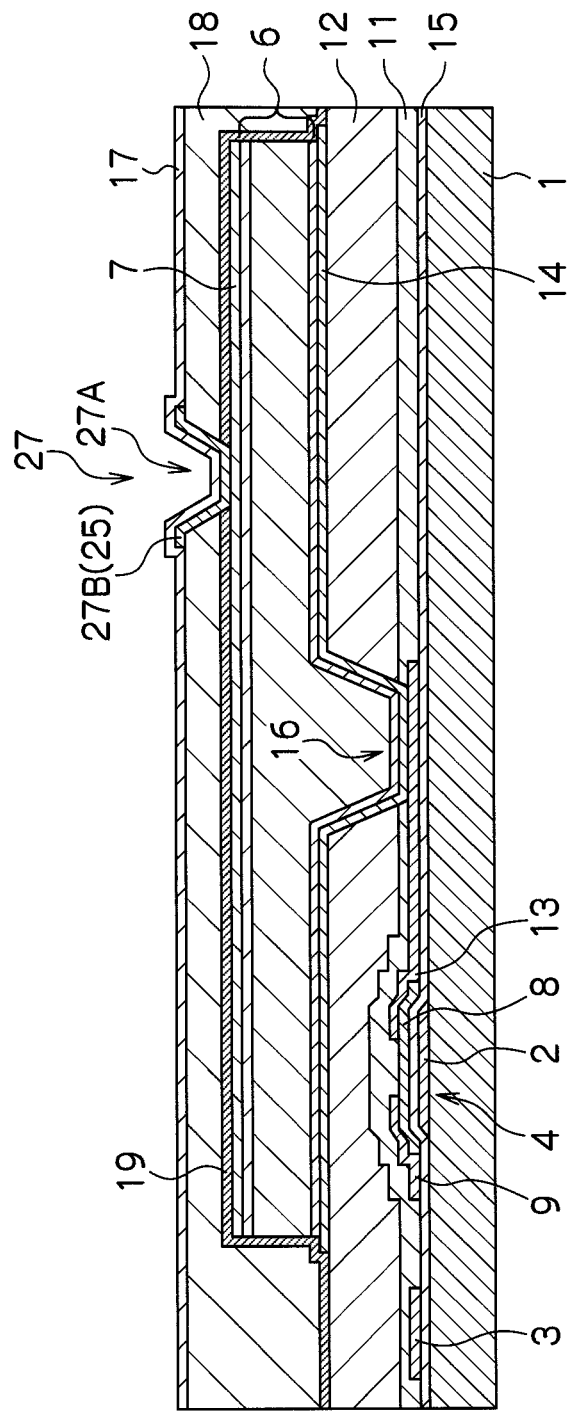
FIG. 8 is a line cross-sectional view showing another example of the electromagnetic wave detecting element relating to the exemplary embodiment.
Figure 9:
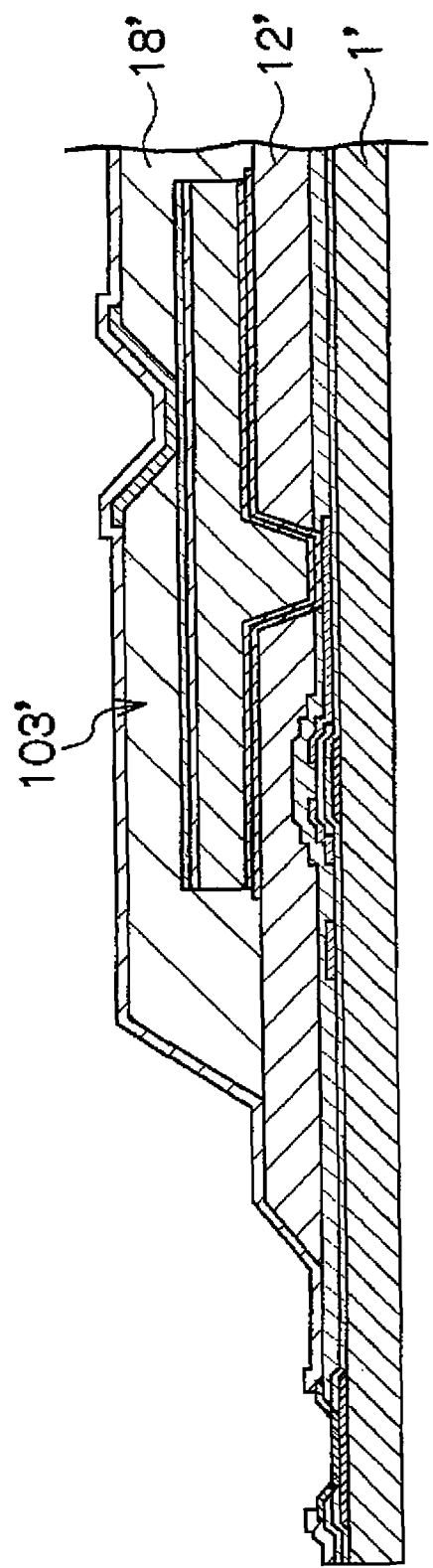
FIG. 9 is a line cross-sectional view of a conventional electromagnetic wave detecting element.

Note that, in the present exemplary embodiment, a protective insulating film 19 may be formed between the interlayer insulating film 12 and the interlayer insulating film 18 as shown in FIG. 8. In this case, the protective insulating film 19 formed from an inorganic material is formed, for example, by CVD film formation on the interlayer insulating film 12 and the semiconductor layer 6 that are formed by the process of FIG. 7G. Thereafter, the process of above-described FIG. 7H is carried out so as to form the interlayer insulating film 18, and the protective insulating film 19 at the contact hole 27A portions is patterned by a photolithographic technique. In this way, the residue, that arises within the contact holes 27A at the time of forming the contact holes 27A in the interlayer insulating film 18, can be removed at the time of patterning the protective insulating film 19.

The present exemplary embodiment describes a case in which the present invention is applied to the electromagnetic wave detecting element 10 that detects an image by detecting X-rays as the electromagnetic waves that are the object of detection. However, the present invention is not limited to the same. The electromagnetic waves that are the object of detection may be, for example, visible light, ultraviolet rays, infrared rays, or the like.

Further, the present exemplary embodiment describes a case in which the present invention is applied to the indirect-conversion-type electromagnetic wave detecting element 10 that once converts radiation into light at the scintillator, and converts the converted light into charges at the semiconductor layer 6 and accumulates the charges. However, the present invention is not limited to the same, and may be applied to, for example, a direct-conversion-type electromagnetic wave detecting element that directly converts radiation into charges at semiconductor layer, and accumulates the charges.

In addition, the structure (see FIG. 1) of the radiation image detection device 100 and the structure (FIG. 2 through FIG. 8) of the electromagnetic wave detecting element 10, that are described in the present exemplary embodiment, are examples. Appropriate changes can, of course, be made thereto within a scope that does not deviate from the gist of the present invention.

What is claimed is:

1. An electromagnetic wave detecting element comprising:
   a substrate including a plurality of scan lines and a plurality of signal lines disposed to intersect one another, and TFT switching elements provided at respective intersection portions of the scan lines and the signal lines;
   a first flattening film formed to cover the TFT switching elements of the respective intersection portions on the substrate, and flattening a surface;
   sensor portions provided on the first flattening film to correspond respectively to the intersection portions so as to form a sensor array, and connected respectively to the TFT switching elements, and generating charges as a result of electromagnetic waves that are an object of detection being irradiated; and
   a second flattening film that flattens and covers: the sensor portions on the first flattening film, a region on the substrate at which the first flattening film is formed, and end portions of the first flattening film at a peripheral portion of end portions of the substrate, wherein the peripheral portion of end portions of the substrate is a region between the sensor portion and the outermost edge of the substrate.

2. The electromagnetic wave detecting element of claim 1, further comprising a protective insulating film formed of an inorganic material and provided between the first flattening film and the second flattening film.

3. The electromagnetic wave detecting element of claim 1, further comprising a protective insulating film formed of an inorganic material and covering the second flattening film.

4. The electromagnetic wave detecting element of claim 1, wherein
   the sensor portions generate charges as a result of light being illuminated, and
   the electromagnetic wave detecting element further comprises a wavelength converting layer provided on the second flattening film such that end portions of the wavelength converting layer are at an inner side of the second flattening film, the wavelength converting layer converting radiation into light.

5. The electromagnetic wave detecting element of claim 4, wherein the wavelength converting layer is formed in a shape of a sheet of a size that is smaller than a size of a region at which the second flattening film is formed, and is provided on the second flattening film by being affixed such that the end portions of the wavelength converting layer are at the inner side of the second flattening film.

\* \* \* \* \*